US012745669B2

(12) United States Patent
Manepalli et al.

(10) Patent No.: US 12,745,669 B2
(45) Date of Patent: Sep. 22, 2026

(54) PROTECTIVE COATING ON AN EDGE OF A GLASS CORE

(71) Applicant: Intel Corporation, Santa Clara, CA (US)

(72) Inventors: Rahul N. Manepalli, Chandler, AZ (US); Srinivas V. Pietambaram, Chandler, AZ (US); Ravindra Tanikella, Chandler, AZ (US); Sameer Paital, Chandler, AZ (US); Gang Duan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 88 days.

(21) Appl. No.: 17/479,033

(22) Filed: Sep. 20, 2021

(65) Prior Publication Data

US 2023/0087838 A1 Mar. 23, 2023

(51) Int. Cl.

| | |
|---|---|
| ***H10W 42/00*** | (2026.01) |
| ***B32B 17/10*** | (2006.01) |
| ***C03C 17/00*** | (2006.01) |
| ***C03C 17/32*** | (2006.01) |
| ***H10W 70/63*** | (2026.01) |

(Continued)

(52) U.S. Cl.

CPC ............. *H10W 74/43* (2026.01); *B32B 17/10* (2013.01); *C03C 17/005* (2013.01); *C03C 17/32* (2013.01); *H10W 42/121* (2026.01); *H10W 74/00* (2026.01); *H10W 74/131* (2026.01); *H10W 74/40* (2026.01); *H10W 74/47* (2026.01); *B32B 2457/14* (2013.01); *C03C 2217/78* (2013.01); *H10W 70/635* (2026.01); *H10W 74/129* (2026.01)

(58) Field of Classification Search

CPC ....... H01L 23/28; H01L 23/29; H01L 23/291; H01L 23/293; H01L 23/3157; H01L 23/562; H01L 23/3114; H01L 23/15; H01L 23/5386; H01L 23/5385; H01L 23/5383; H01L 23/5384; H01L 25/0655; H01L 23/08; C03C 15/00; C03C 17/005; C03C 17/32; C03C 2217/78; H10W 42/121; H10W 74/00; H10W 74/47; H10W 74/129; H10W 74/131; H10W 70/635; H10W 90/00; H10W 90/401; B32B 17/10; B32B 2457/04; B32B 2457/14

USPC .................................................. 438/106–127

See application file for complete search history.

(56) References Cited

U.S. PATENT DOCUMENTS 6,696,325 B1 * 2/2004 Tsai .................. H01L 21/76251 438/149
9,443,782 B1 * 9/2016 Steimle ............. H01L 21/02013

(Continued)

FOREIGN PATENT DOCUMENTS

WO WO-2014188825 A1 * 11/2014 ............. B32B 27/06

*Primary Examiner* — Michael C. Romanowski

(74) *Attorney, Agent, or Firm* — Schwabe, Williamson & Wyatt, P.C.

(57) ABSTRACT

Embodiments described herein may be related to apparatuses, processes, and techniques directed to a protective coating for an edge of a glass layer, in particular a glass core within a substrate of a package, where the protective coating serves to protect the edge of the glass core and fill in cracks at the edges of the glass. This protective coating will decrease cracking during stresses applied to the glass layer during manufacturing or operation. Other embodiments may be described and/or claimed.

8 Claims, 20 Drawing Sheets

(51) Int. Cl.
*H10W 74/00* (2026.01)
*H10W 74/10* (2026.01)
*H10W 74/40* (2026.01)
*H10W 74/43* (2026.01)
*H10W 74/47* (2026.01)

(56) References Cited

U.S. PATENT DOCUMENTS

2004/0067343 A1* 4/2004 Beteille ............. B32B 17/10302 428/192
2005/0287714 A1* 12/2005 Walk ..................... H01L 21/481 438/126
2008/0268614 A1* 10/2008 Yang ................... H01L 21/2007 438/455
2011/0065238 A1* 3/2011 Chiou ..................... H01L 24/81 438/118
2011/0091685 A1* 4/2011 Farooq .................... B32B 27/08 156/60
2012/0058623 A1* 3/2012 Hsieh .................. H01L 21/6835 438/459
2012/0121912 A1* 5/2012 Varma ............... B32B 17/10743 522/42
2012/0295375 A1* 11/2012 Yamazaki ......... H01L 29/78603 257/E33.059
2013/0328174 A1* 12/2013 La Tulipe, Jr. ......... H01L 25/50 257/629
2015/0294892 A1* 10/2015 Lei ...................... H01L 21/3065 438/464
2016/0111380 A1* 4/2016 Sundaram ......... H01L 23/49822 438/126
2016/0152006 A1* 6/2016 Boek ....................... C03C 15/00 428/34.7
2019/0126594 A1* 5/2019 Boek ......................... B32B 1/08
2020/0357734 A1* 11/2020 Koga ................... H05K 3/0017
2021/0159134 A1* 5/2021 Bellman ................. C03C 15/00

* cited by examiner

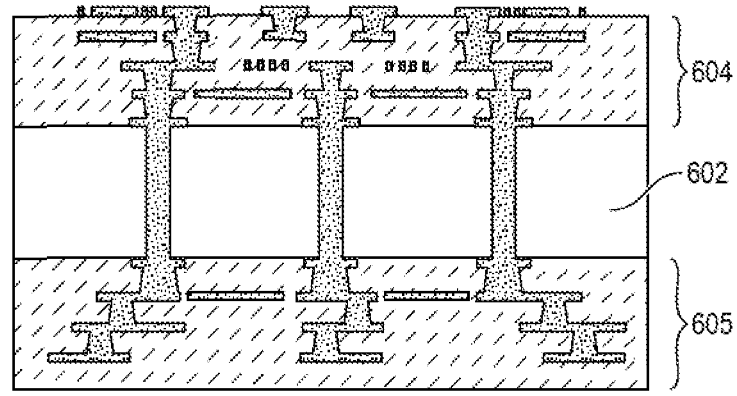
FIG. 6E
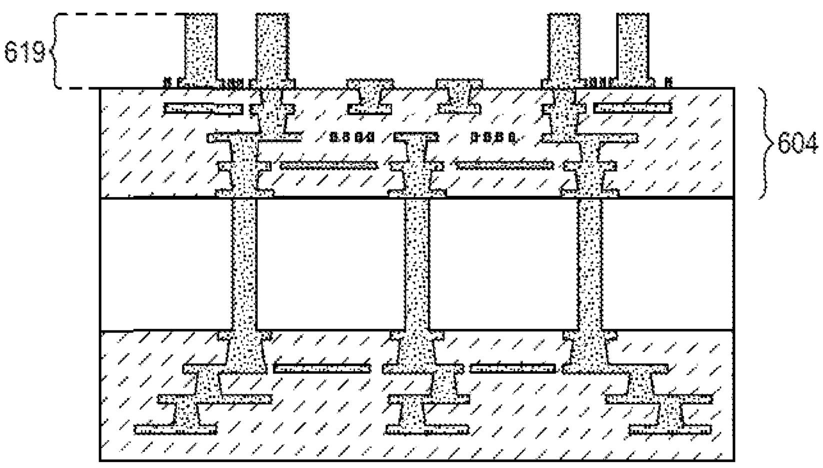
FIG. 6F
617
619
604
FIG. 6G

PROTECTIVE COATING ON AN EDGE OF A GLASS CORE

FIELD

Embodiments of the present disclosure generally relate to the field of semiconductor packaging, and in particular to packages that include glass layers or glass cores.

BACKGROUND

Continued growth in computing and mobile devices will continue to increase the demand for bandwidth density and reliability of semiconductor packages.

DETAILED DESCRIPTION

Figure 1:
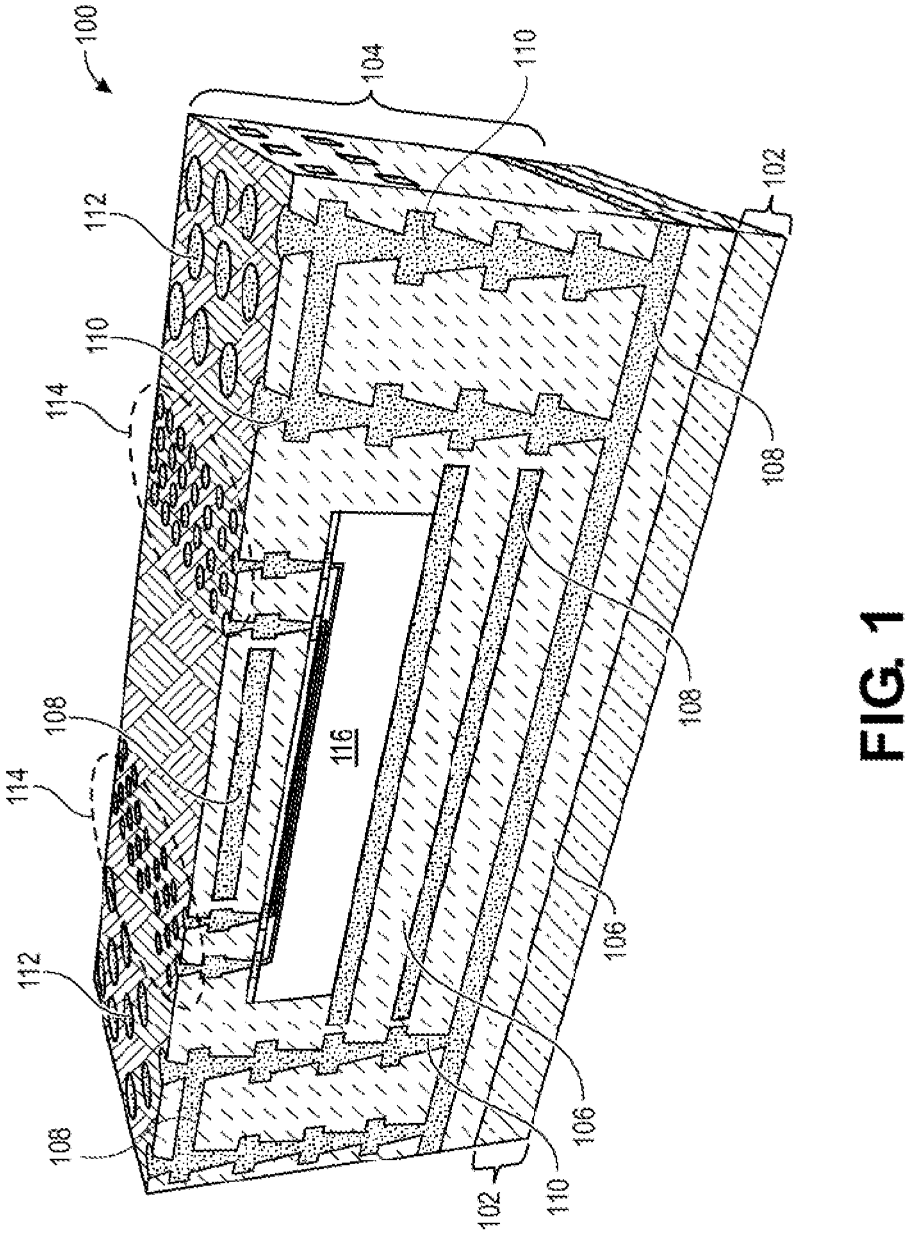
FIG. 1 illustrates perspective drawings of packages with glass cores, in accordance with various embodiments.
Figure 1:
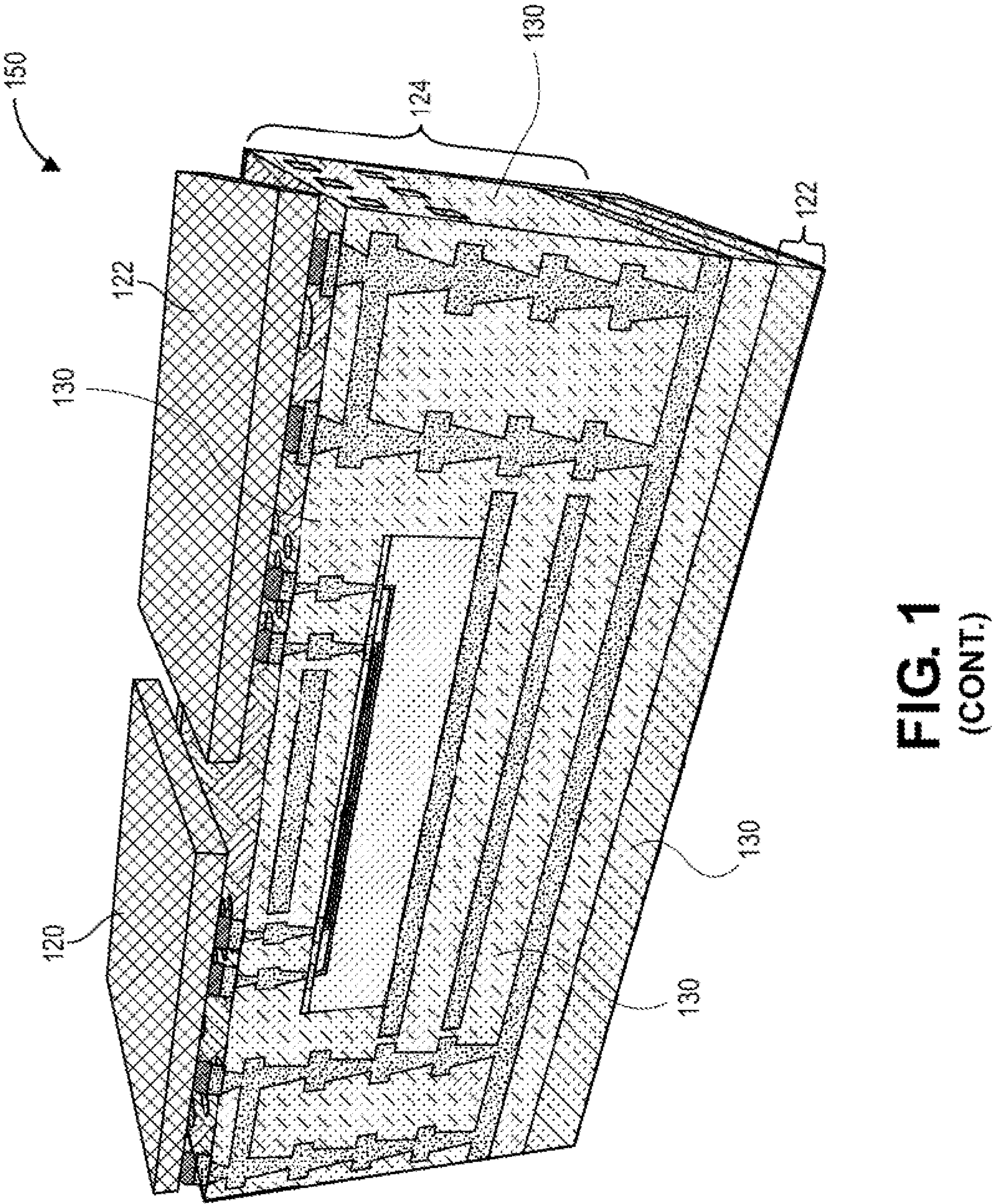

Embodiments described herein may be related to apparatuses, processes, and techniques related to a glass layer, for example a glass core, within a substrate of a package, where a protective coating is applied to the edges of the glass core. In embodiments, this protective coating may serve as an edge protection technique to protect the glass core during stresses that occur to the glass.

In particular, that protective coating may be used to prevent any cracks from forming at the edges of the glass core. These cracks, after forming, may spread over time into the interior of the glass core and weaken the glass structure and package. In addition, the protective coating may be used to fill or partially fill any cracks that may exist at the edges of the glass core at the time of manufacture, and prevent these cracks from further spreading over time. Embodiments described herein may result in decreased warpage of a package that uses a rigid glass core, while mitigating fractures that may form at the edge of the glass core due to stresses placed upon the glass core during manufacturing, insertion, and/or operation.

Reducing the footprint of transistors and other components within a package has become increasingly difficult and costly from a legacy manufacturing point of view. Alternative legacy packaging solutions include, for example, integrating heterogeneous components that include dissimilar chips with different functions into a package. These heterogeneous components may use lateral connections, or vertical connections. Although various designs for these package solutions may be quite different, the basic concept for improving package performance is to achieve chip stacking using thinned chips, and increasing input/output (I/O) density for multichip integration.

During manufacturing of such packages a temporary rigid carrier wafer, for example a glass wafer, may be used and may be based on a temporary bonding and debonding technology. The temporary rigid glass carrier wafer facilitates handling of thinned chips and of grinding dielectric materials for revealing lithography formed plated vias (LIVs). Furthermore, a low total thickness variation (TTV), for example of 10 μm or less, associated with glass facilitates a stringent via-to-pad overlay of avg+4 sigma that is less than or equal to 4 μm for fine pitch scaling up to 2/2 μm LS.

One legacy manufacturing challenge associated with the temporary bonding and debonding technology using a rigid glass carrier wafer includes warpage and/or shrinkage control after the removal of the rigid carrier. For example, after the rigid carrier is debonded after the first level interconnect (FLI) bump formation, the legacy package substrate is expected to warp due to inbuilt residual stress and coefficient of thermal expansion (CTE) mismatches between various components. For example, there are different CTEs for silicon (2.6 ppm/° C.), ABF (~39 ppm/° C.) and copper (17 ppm/° C.). Such CTE mismatch may in turn impact the backend process for mid-level interconnect (MLI) bump formation, and also the assembly thermal-compression bonding (TCB) process.

In embodiments, this legacy manufacturing challenge may be addressed by using a glass layer as a permanent substrate core. Advantages of using a glass core include maintaining a TTV requirement of 2-3 μm, for a less than or equal to 30 μm bump pitch scaling. Although a glass core has the advantage of flatness and rigidity, glass may be fragile and/or brittle, and may be subjected to edge cracking, edge strains, or fatigue failure based on differing CTE of components, stresses applied to the glass core during singulation, TCB, and/or other handling. In embodiments, edge protection techniques described herein may be applied to glass cores, or glass layers in general, alone or as part of a substrate or a package to improve substrate reliability and package assembly yield.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

FIG. 1 illustrates perspective drawings of packages with glass cores, in accordance with various embodiments. Package 100 shows a glass core 102 on to which a buildup layer 104 is coupled. In embodiments, the glass core 102 may range in thickness from 100 um to 3000 um or more. In embodiments, the glass core 102 may be a monolithic glass. The buildup layer 104 may include a plurality of dielectric layers 106 and metal layers 108 that are separated by the dielectric layers 106 to perform electrical routing functions. In addition, the buildup layer 104 may also include vias 110 used to electrically couple the metal layers 108. The top of the buildup layer 104 may include one or more pads 112 that may be used to provide power, and may include one or more signal pads 114 that may be used to provide signal routing between dies or chiplets that may be electrically coupled to a top of the buildup layer 104.

Package 100 may also include a bridge 116 that may be used to electrically couple the signal pads 114. In embodiments, the bridge 116 may be an embedded multi-die interconnect bridge (EMIB). In embodiments, the bridge 116 may be some other passive die component. It should be noted that the individual components, in particular the dielectric layers 106, metal layers 108, vias 110, and bridge 116 may have different CTEs which, during operation, may cause the buildup layer 104 to warp. In embodiments, the location of the glass core 102 is to provide a rigid planar surface to mitigate this warpage. As a result, the signal pads 114, as well as other traces in the metal layers 108 may be placed with a tighter pitch within the buildup layer 104.

Package 150 may be similar to package 100, with the exception that a first die 120 and a second to die 122 are electrically and physically coupled to a top of the buildup layer 124, which may be similar to buildup layer 104 of diagram 100. Buildup layer 124 is physically coupled to the top of a glass core 122, which may be similar to glass layer 102 of package 100. In addition, a protective coating 130 has been added to the edge of the buildup layer 124 and the glass core 122, to provide edge protection to the glass core 122. In embodiments, this protective coating 130 may completely surround the buildup layer 124 and the glass core 122. In other embodiments, the protective coating 130 may be selectively applied to one or more edges of the glass core 122, and may be only partially applied to edges of the buildup layer 124.

Figure 2:
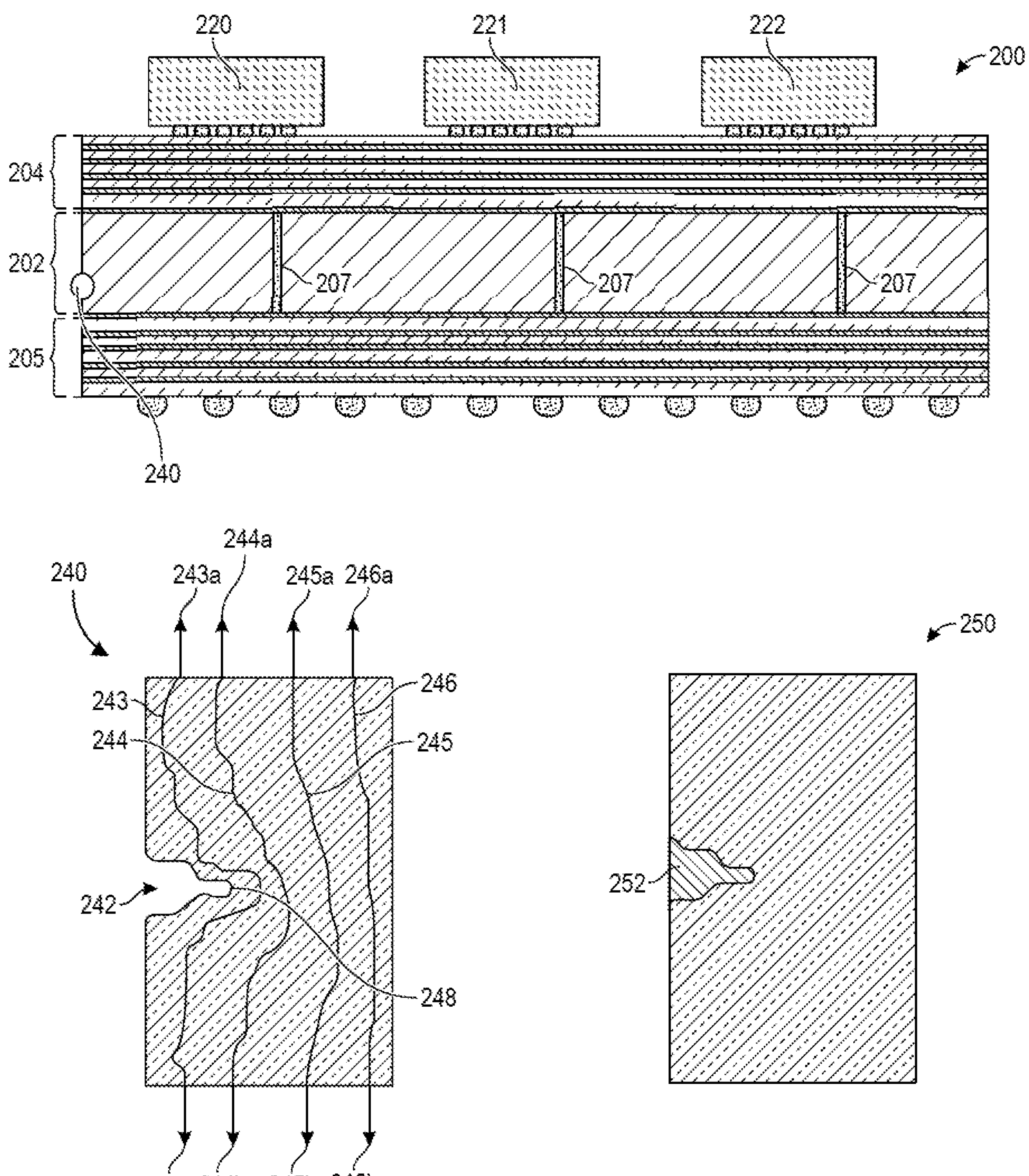
FIG. 2 illustrates an example of edge cracking within a glass core.

FIG. 2 illustrates an example of edge cracking within a glass core. Substrate 200, which may be similar to substrate 150 of FIG. 1, includes a glass core 202, a first buildup layer 204 on a first side of the glass core 202, and a second buildup layer 205 on a second side of the glass core 202. The glass core 202 may also include a plurality of through glass vias (TGV) 207. A plurality of dies 220, 221, 222, which may be similar to dies 120, 122 of FIG. 1, are electrically and physically coupled with the first buildup layer 204. A region 240 of the glass core 202 is expanded to show the various stresses that may act on the glass core 202 and how the stresses may manifest as cracks 242 on the edge of the glass core 202.

Cracks 242 may be caused by a number of different factors. For example, there may be an imperfection in the glass near its edge that will cause the cracks 242 to form. Stresses may be introduced during the singulation of the substrate 200. For example, the process of cutting with diamond saw through various material stacks of metal such as copper, organics such as ABF or solder resist, and glass might result in non-uniform stresses applied across the glass core 202, resulting in fine cracks 242 along the glass edge. In other examples, warpage during the manufacturing process, such as applying buildup layers such as buildup layers 204, 205, or applying dies such as dies 220, 221, 222 that involve a combination of wet and dry processes may introduce stress cracks 242. The presence of cracks 242 during the TCB assembly process may act as a stress concentration point and result in cracks 242 propagation and eventual failure of the substrate 200.

An example of various stresses that may be applied to the glass core 202 are shown in region 240. Surrounding crack 242, various level curves 243, 244, 245, 246 of stress points are shown. Level curve 243 shows a force applied at the top of the glass **243*a* and a force applied at the bottom of the glass 243*b*. Level curve 244 shows a force applied at the top of the glass 244*a* and a force applied at the bottom of the glass 244*b*. Level curve 245 shows a force applied at the top of the glass 245*a* and a force applied at the bottom of the glass 245*b*. Level curve 246 shows a force applied at the top of the glass 246*a* and a force applied at the bottom of the glass 246*b*. Note that at the tip of the crack 248, the level curves 243, 244, 245, 246** show a concentration of stress which may allow for easy crack propagation as additional stress is applied during assembly and/or operation.

For the glass core 202, an equation may be used to describe fracture toughness $$K_{ic}=Y\sigma\sqrt{\pi a}$$

Where $K_{ic}$ is a fracture toughness, σ is the applied stress, a is the crack length, and Y is a geometrical factor.

Diagram 250 shows the glass of region 240, with a protective coating 252 or fill material that is placed within the region of the crack 242. This fill material may be crack resistant ink material that is used to fill in cracks 242 and arrest or inhibit crack propagation. In embodiments, the protective coating 252 may be referred to as a fill material, a crack resistant coating, an edge coating, an edge protection ink, or a protective layer.

This protective coating 252 may include a water soluble emulsion resin. In embodiments, the protective coating 252 may be applied using an ink jet coating technique, or some other coating or application process. In embodiments, the inkjet coating technique may allow for higher manufacturing throughput.

Figure 3:
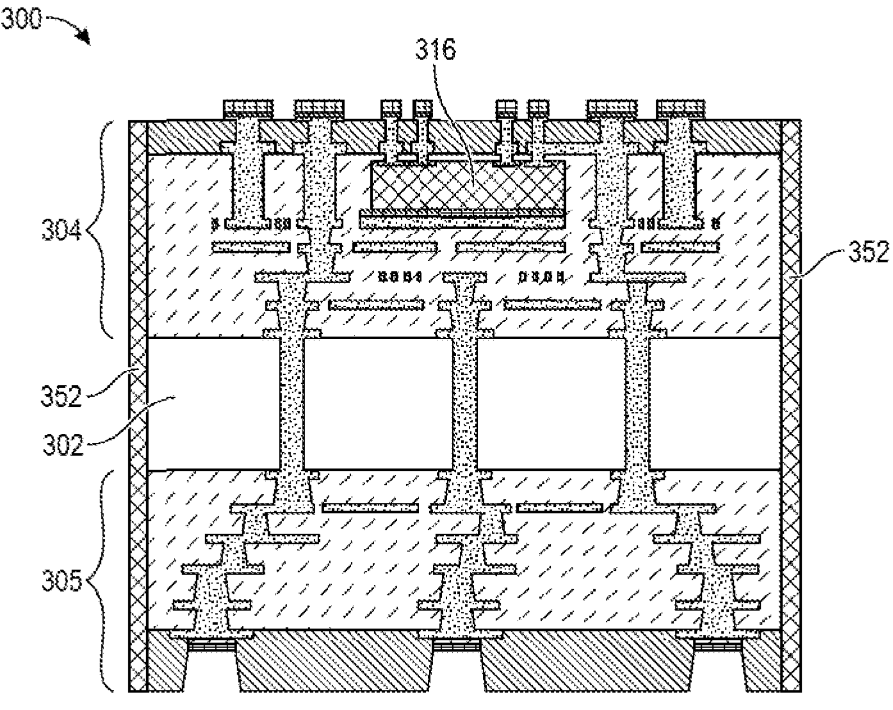
FIG. 3 illustrates side and top down views of a package that includes a passive silicon bridge and a glass core with a protective coating on the edge, in accordance with various embodiments.
Figure 3:
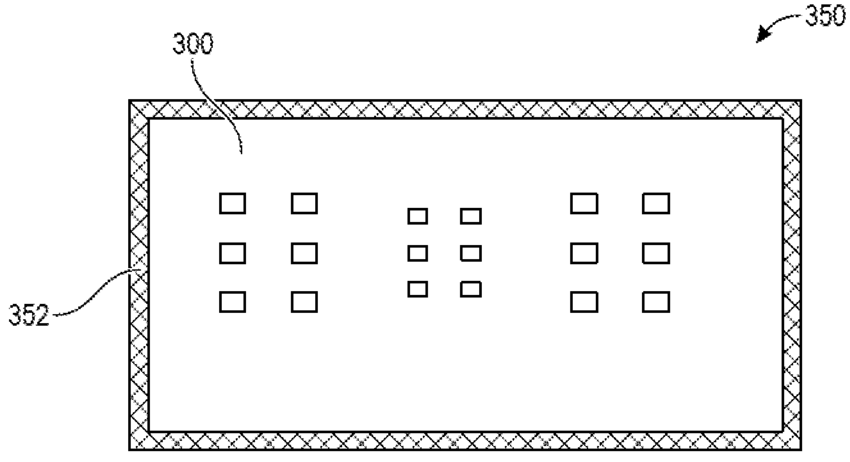
Figure 3:
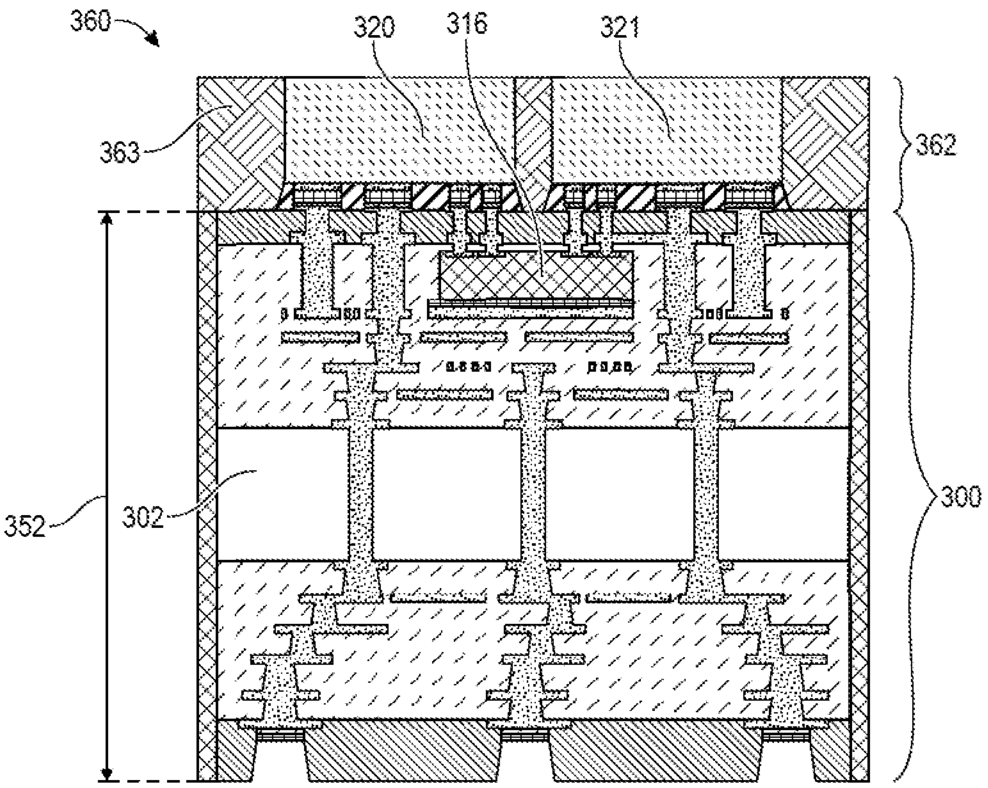

FIG. 3 illustrates a cross-section side view and top down view of a package that includes a passive silicon bridge and a glass core with a protective coating, in accordance with various embodiments. Substrate 300 is a cross-section side view that shows a glass core 302, a first buildup layer 304, and a second buildup layer 305, which may be similar to glass core 202, first buildup layer 204, and second buildup layer 205 of FIG. 2. The first buildup layer 304 and the second buildup layer 305 may include sublayers of dielectric that separates routing layers, as well as metallized vias to electrically couple the routing layers. A passive element 316 may be embedded within the first buildup layer 304. The passive element 316 may be a bridge used to electrically couple dies such as dies 320, 321 of package 360.

A protective coating 352, is applied to the edges of the substrate 300 after singulation. A thickness of the protective coating 352 may range from 0.1 um to 1000 um. Diagram 350 shows a top-down view of package 300, where the protective coating 352 surrounds the edge of the package 300. In other embodiments, the protective coating 352 may only be applied to edges of the glass core 302. In still other embodiments, the protective coating 352 may only be applied to some of the edges of the glass core 302, or to some edges of the package 300.

Package 360 includes a layer 362 that is coupled to the top of the substrate 300. Layer 362 includes a first die 320 and a second die 321 that is electrically coupled with the substrate 300, and are electrically coupled with each other using the passive die 316, in this case a bridge such as an EMIB. A mold compound 363 may surround the dies 320, 321. Note that an edge of the layer 362 may not include the protective coating 352. During assembly of the layer 362 to the substrate 300, the glass core 302 is protected from cracking during handling or TCB processes while the layer 362 is applied.

Figure 4:
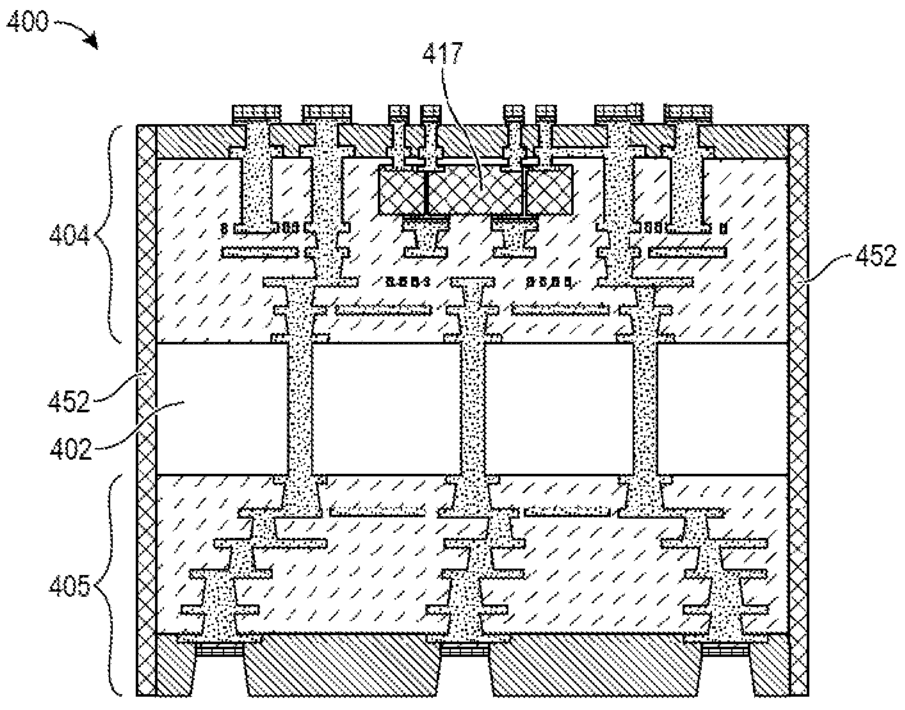
FIG. 4 illustrates side and top down views of a package that includes a silicon bridge with through silicon vias (TSVs) and a glass core with a protective coating on the edge, in accordance with various embodiments.
Figure 4:
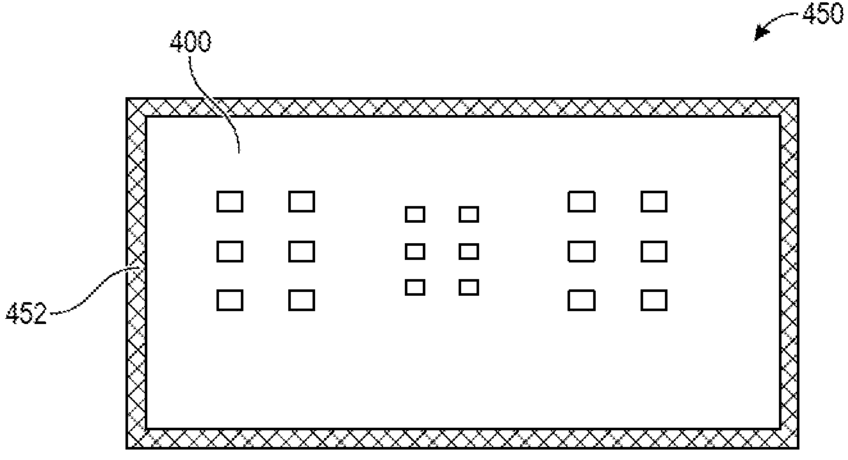
Figure 4:
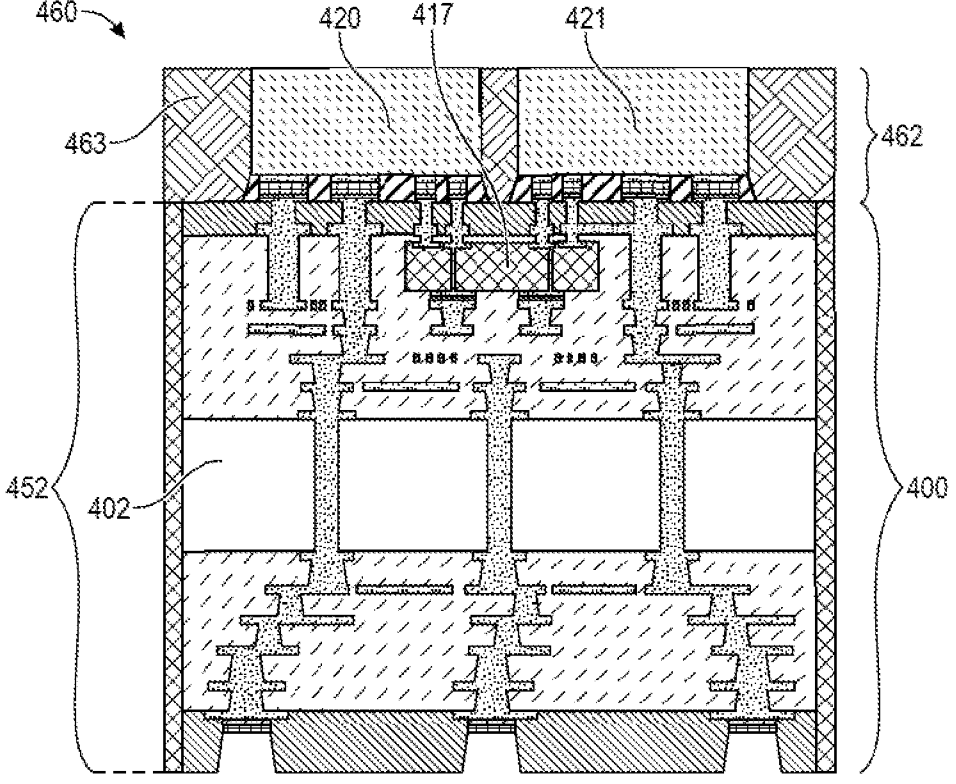

FIG. 4 illustrates side and top down views of a package that includes a silicon bridge and a glass core with a protective coating, in accordance with various embodiments. Substrate 400 is a cross-section side view that shows a glass core 402, a first buildup layer 404, and a second buildup layer 405, which may be similar to glass core 302, first buildup layer 304, and second buildup layer 305 of FIG. 3. The first buildup layer 404 the second buildup layer 405 may include sublayers of dielectric that separates routing layers, as well as metallized vias to electrically couple the routing layers. An active element 417, such as an active die may be embedded within the first buildup layer 404 and coupled with one or more routing sublayers in the first buildup layer 404. The active element 417 may be a computational die to electrically couple with and interact with dies 420, 421 of package 460.

A protective coating 452, is applied to the edges of the substrate 400 after singulation. Diagram 450 shows a top-down view of package 400, the protective coating 452 surrounds the edge of the package 400. In other embodiments, the protective coating 452 may only be applied to edges of the glass core 402. In still other embodiments, the protective coating may only be applied to some of the edges of the glass core 402.

Package 460 includes a layer 462 that is coupled to the top of the substrate 400. Layer 462 includes a first die 420 and a second die 421 that is electrically coupled with the substrate 400, and are electrically coupled to the active element 417. In embodiments, there may be one or more TSV through the active element 417. A mold compound 463 may surround the dies 420, 421. Note that an edge of the layer 462 may not include the protective coating 452. During assembly of the layer 462 to the substrate 400, the glass core 402 is protected from cracking during handling or TCB processes while the layer 462 is applied.

Figure 5A:
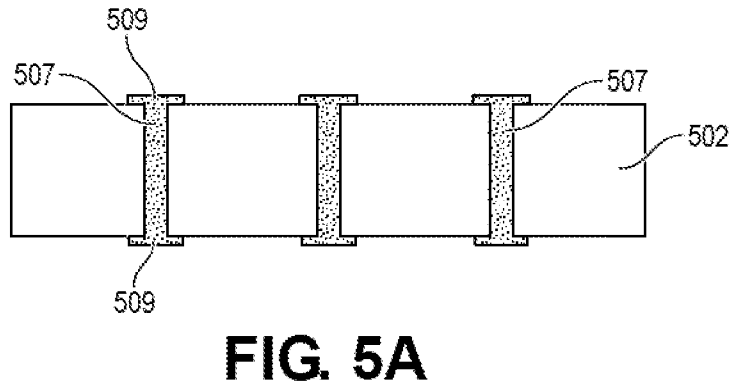
FIGS. 5A-5F illustrate stages in a manufacturing process for manufacturing a package that includes a passive silicon bridge and a glass core with protective coating on the edge, in accordance with various embodiments.

FIGS. 5A-5F illustrate stages in a manufacturing process for manufacturing a package that includes a passive silicon bridge and a glass core with protective coating on the edge, in accordance with various embodiments. FIG. 5A shows a stage in the manufacturing process that includes identifying a glass core 502, which may be similar to glass core 202 of FIG. 2, into which a plurality of plated TGV 507 have been formed. In embodiments, the TGV may be formed using techniques similar to those described below with respect to FIG. 7. The plated TGV 507 may also include pads 509 on either side of the glass core 502 that are electrically coupled via the plated TGV 507.

Figure 5B:
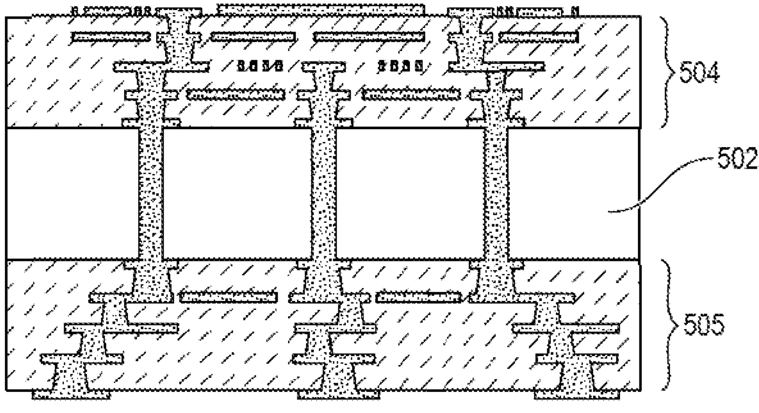

FIG. 5B shows a stage in the manufacturing process where a first buildup layer 504 is coupled with a first side of the glass core 502 and a second buildup layer 505 is coupled with the second side of the glass core 502 opposite the first side. In embodiments, the first buildup layer 504 and the second buildup layer 505 may include sublayers of dielectric and routing layers. In embodiments, plated vias may electrically couple various routing layers. In embodiments, the first buildup layer 504 and the second buildup layer 505 may be constructed using standard buildup processes and techniques.

Figure 5C:
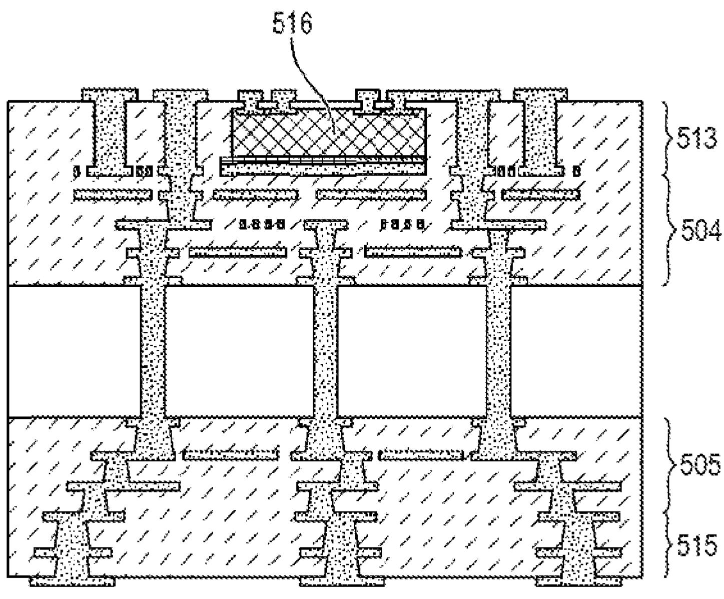

FIG. 5C shows a stage in the manufacturing process where a bridge 516, which may be similar to bridge 316 of FIG. 3, is mounted within the first buildup layer 504, and additional buildup layer 513 encapsulates the bridge 516 on top of the first buildup layer 504. An additional buildup layer 515 is also applied to the second buildup layer 505.

Figure 5D:
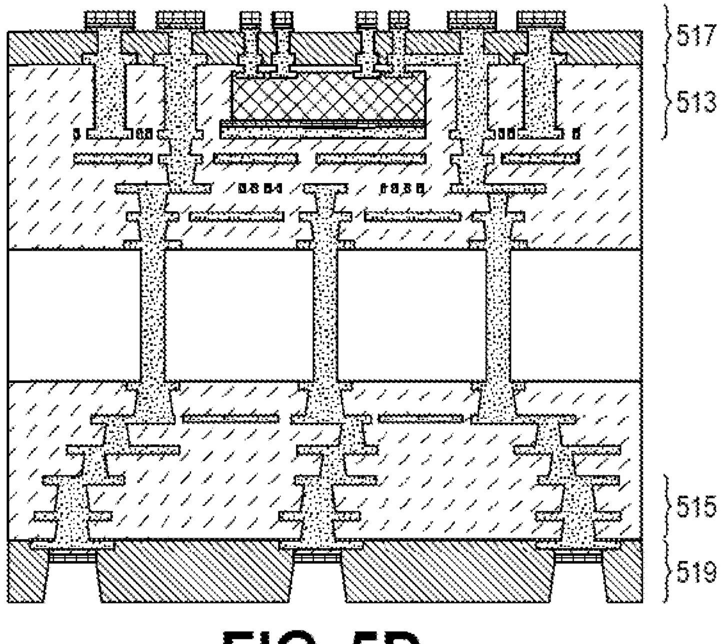

FIG. 5D shows a stage in the manufacturing process where a first layer of first level interconnects (FLI) 517 are applied to the additional buildup layer 513. In addition, a second layer of secondary level interconnect SLI 519 are applied to the additional buildup layer 515. In embodiments, after this stage of the manufacturing process, singulation may occur where the individual packages of FIG. 5D are separated from a fabrication wafer.

Figure 5E:
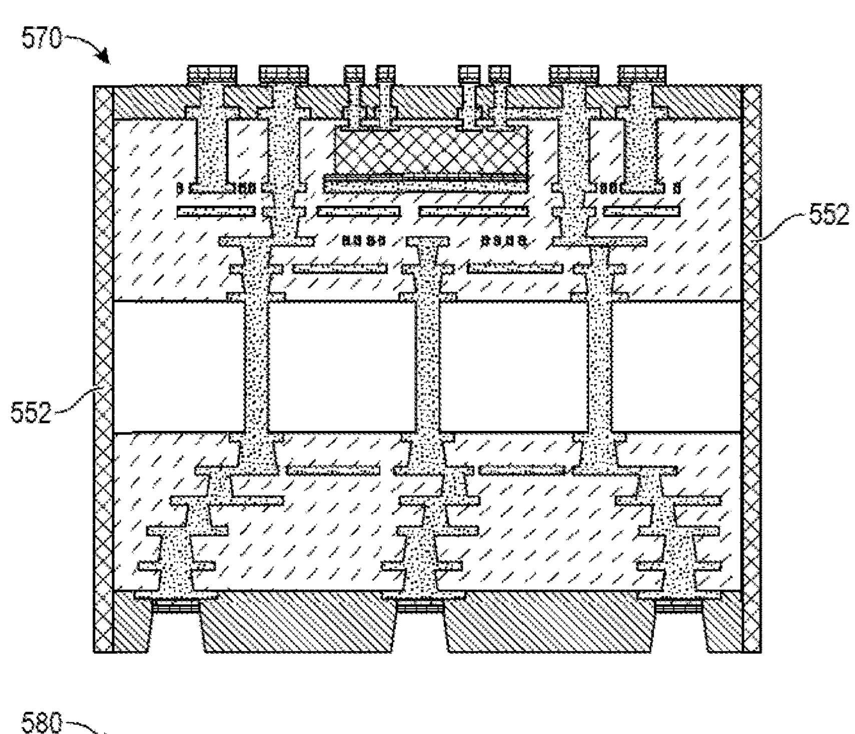
Figure 5E:
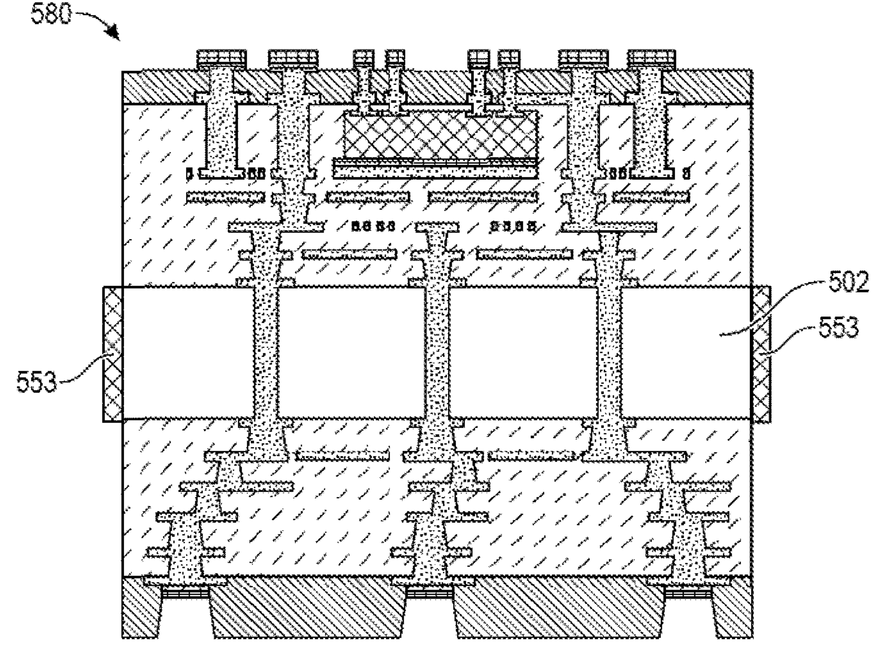
Figure 5E:
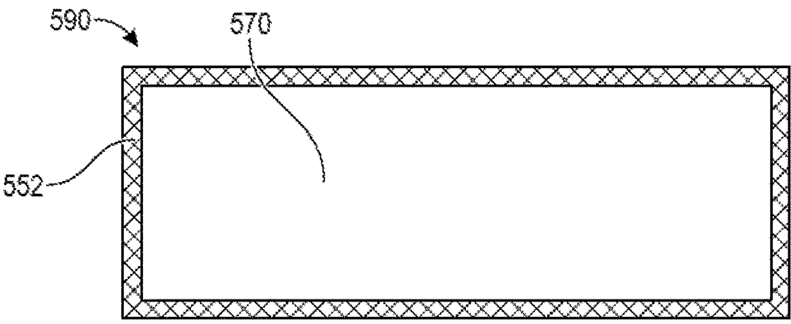

FIG. 5E shows a stage in the manufacturing process where a protective coating is applied to the edges of the singulated package as shown with respect to FIG. 5D. Package 570 shows a cross section view of the protective coating 552, which may be similar to protective coating 352 of FIG. 3, extending from the top of the package to the bottom of the package. Package 580 shows a cross section view of a different embodiment, where the protective coating 553, which may be similar protective coating 352 of FIG. 3, is applied only along the edge of the glass core 502. Package 590 shows a top-down view of the protective coating 552 surrounding the package 570.

Figure 5F:
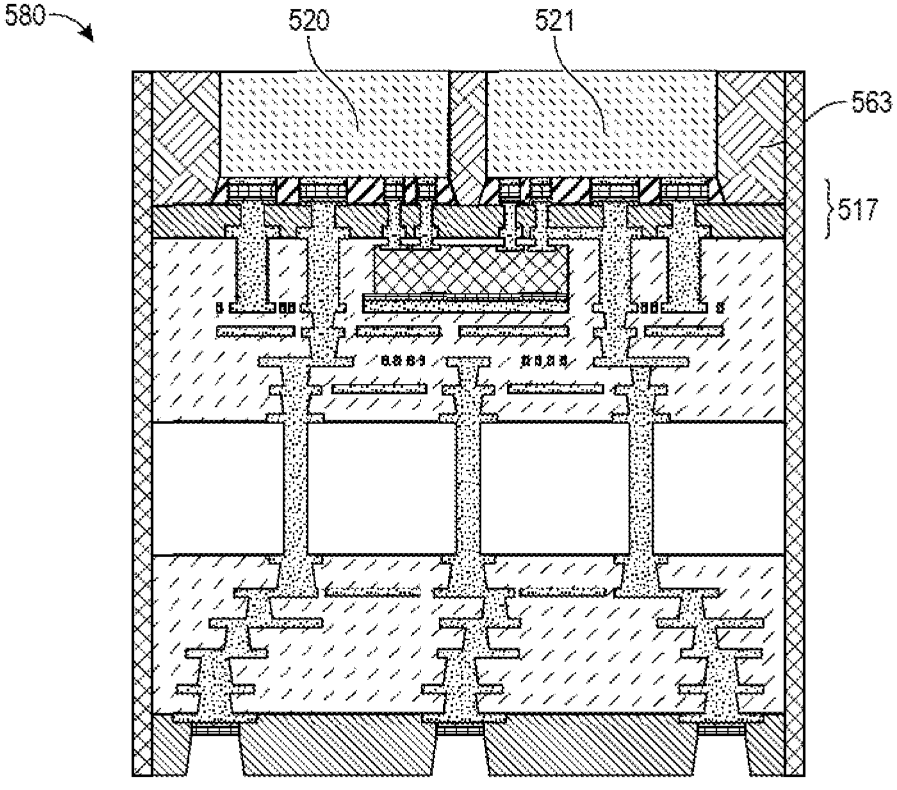
Figure 5F:
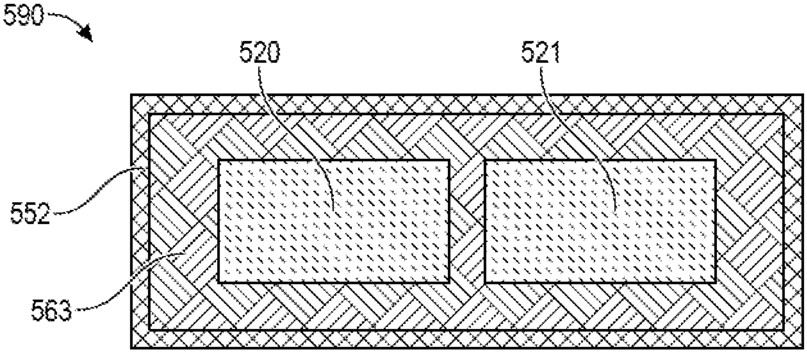

FIG. 5F shows a stage in the manufacturing process where dies are attached. Package 580 shows dies 520, 521, which may be similar to dies 320, 321 of FIG. 3, coupled with the first layer of FLI 517. A molding 563, which may be similar to molding 363 of FIG. 3, may be applied and surrounds dies 520, 521. Package 590 is a top-down view of package 580 that shows the protective coating 552 surrounding the edge of the package. In embodiments, the protective coating 552 is not coupled with the molding 563.

Figure 6A:
FIGS. 6A-6O illustrate stages in a manufacturing process for manufacturing a package that includes an active die or a silicon bridge with TSVs and a glass core with protective coating on the edge, in accordance with various embodiments.
Figure 6B:
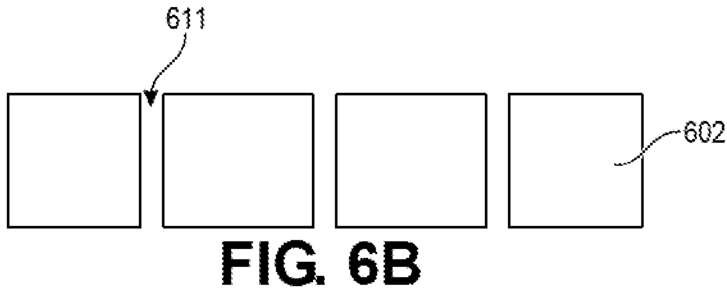
Figure 6C:
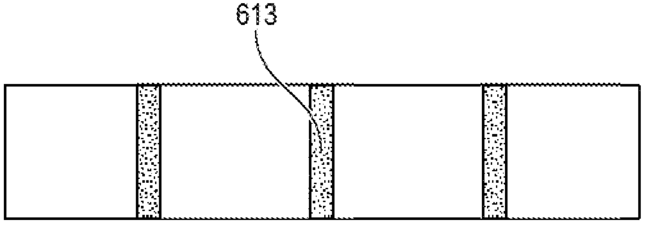
Figure 6D:
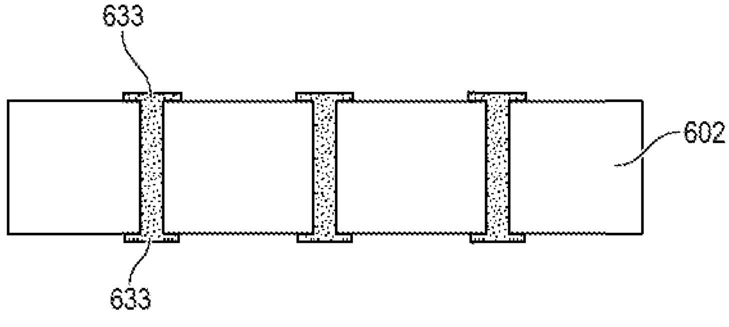
Figure 6H:
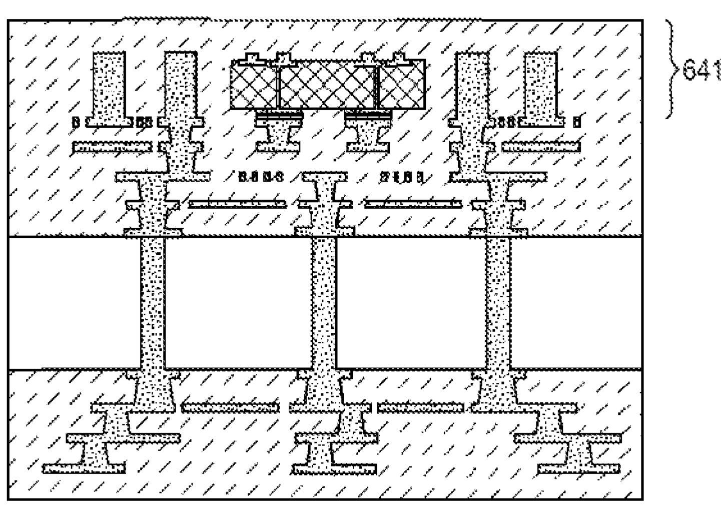
Figure 6I:
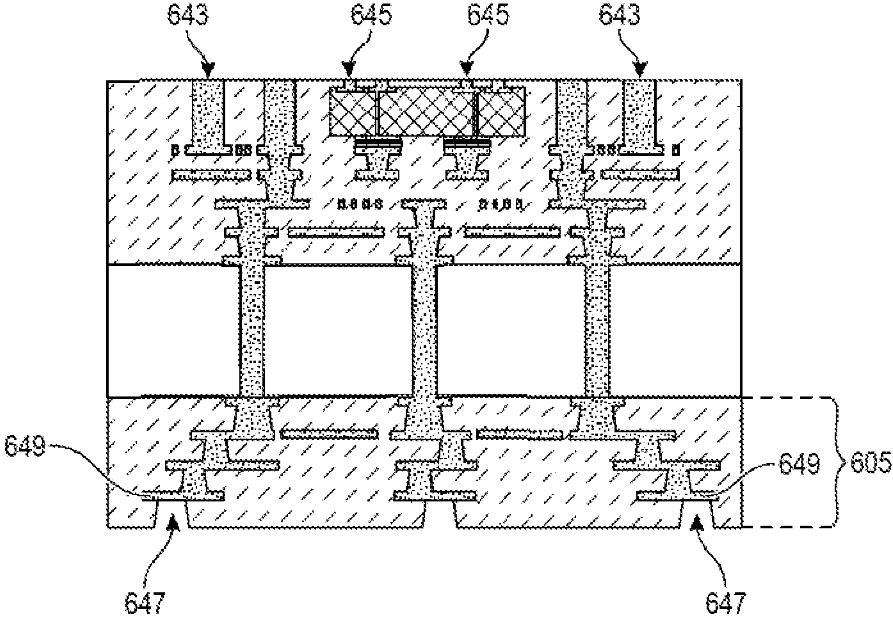
Figure 6J:
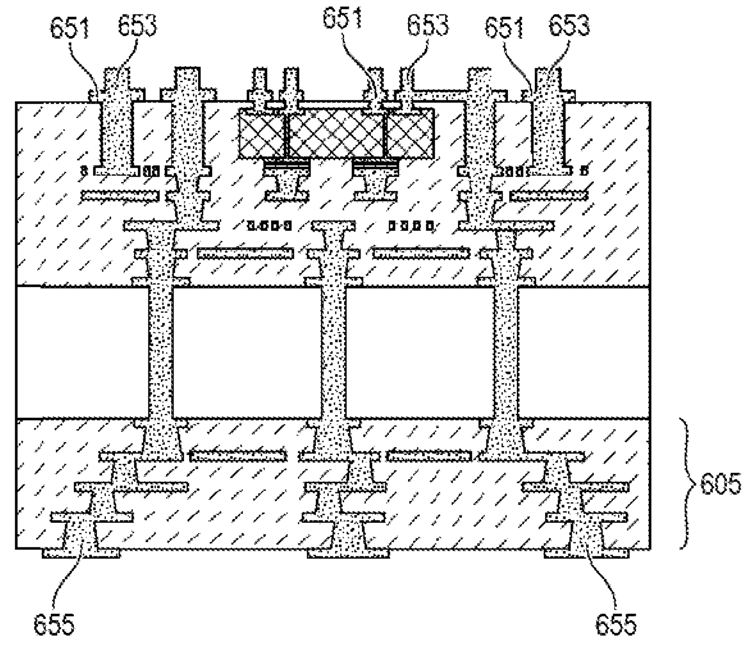
Figure 6K:
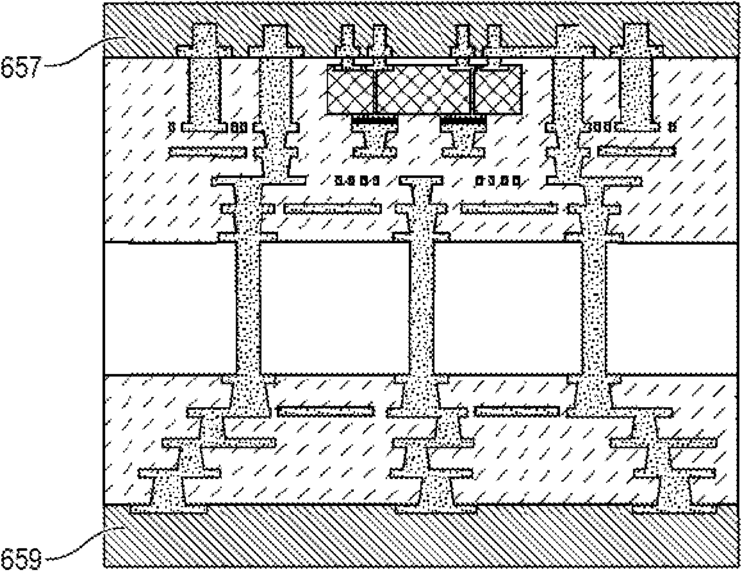
Figure 6L:
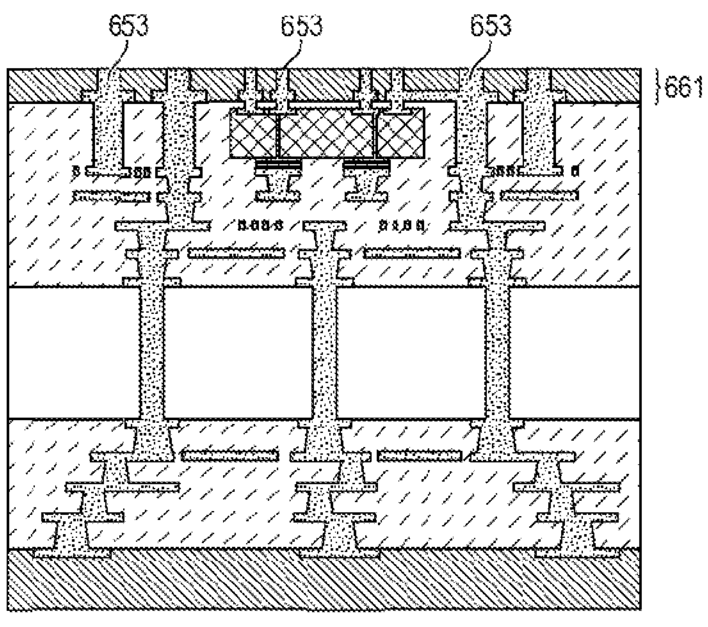
Figure 6M:
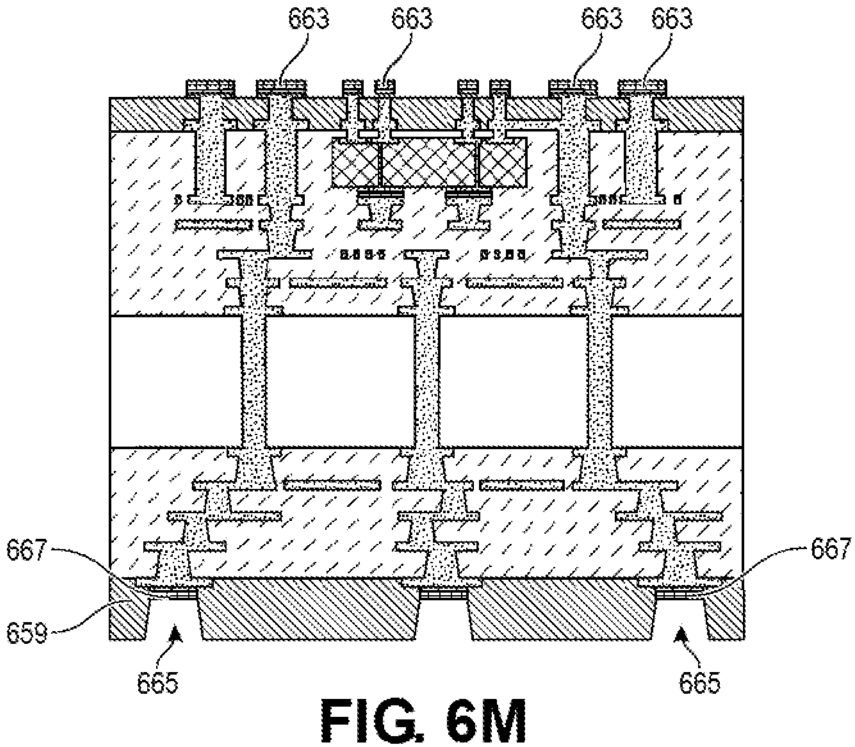
Figure 6N:
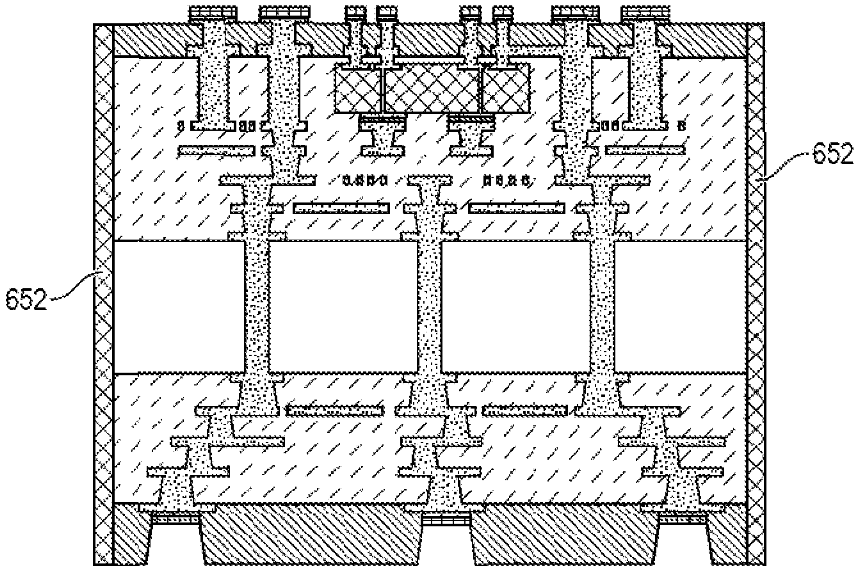
Figure 6O:
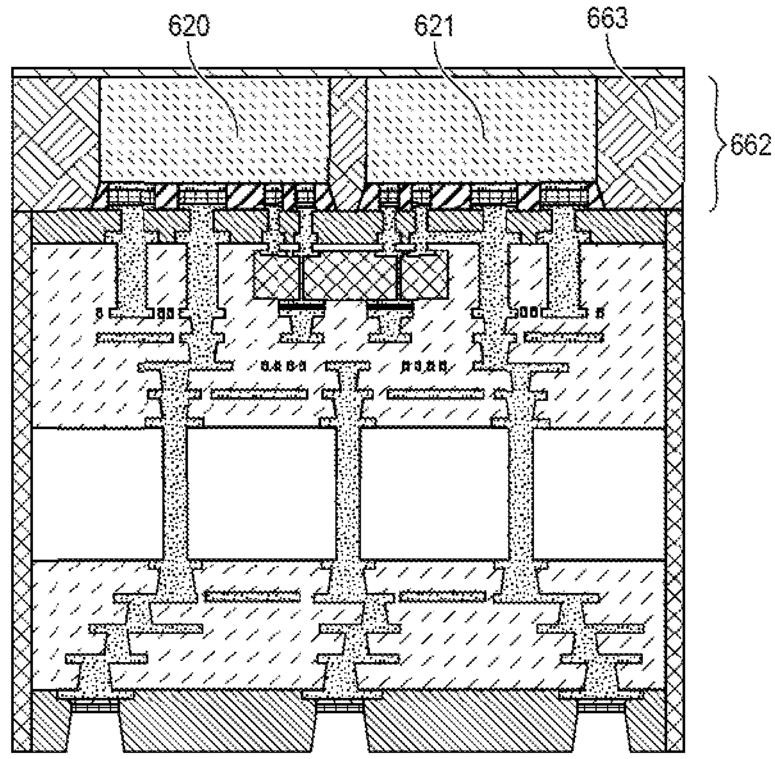

FIGS. 6A-6O illustrate stages in a manufacturing process for manufacturing a package that includes an active die or a silicon bridge with TSVs and a glass core with protective coating on the edge, in accordance with various embodiments. FIG. 6A shows a stage in the manufacturing process where a glass core 602, which may be similar to the glass core 402, is identified.

FIG. 6B shows a stage in the manufacturing process where TGVs 611 are formed within the glass core 602. In embodiments, the TGVs 611 may be formed using a drill or by using techniques described below with respect to FIG. 7.

FIG. 6C shows a stage in the manufacturing process where the TGVs 611 are plated with an electrically conductive material 613 such as copper.

FIG. 6D shows a stage in the manufacturing process where pads 633 are patterned on the glass core 602.

FIG. 6E shows a stage in the manufacturing process where a first buildup layer 604 and a second buildup layer 605 are formed on either side of the glass core 602, and include sublayers of dielectric and electrical routing layers. In embodiments, these buildup layers 604, 605 may be referred to as redistribution layers (RDL).

FIG. 6F shows a stage in the manufacturing process where copper pillars 619 are formed on the first buildup layer 604.

FIG. 6G shows a stage in the manufacturing process where an active die 617 is placed within the layer of copper pillars 619. In embodiments, the active die 617 may include an active bridge or a processor. In embodiments, the active die 617 will be electrically coupled with one or more electrical routing layers within the first buildup layer 604

FIG. 6H shows a stage in the manufacturing process where the copper pillars 619 and the active die 617 are encapsulated within a dielectric material 641.

FIG. 6I shows a stage in the manufacturing process where the dielectric material 641 is polished or ground to reveal copper pillars 643 and active die pillars 645. In embodiments, vias 647 are drilled to expose copper pad 649 of the second buildup layer 605.

FIG. 6J shows a stage in the manufacturing process where additional copper pads 651 and pillars 653 are placed on the copper pillars 643 and active die pillars 645. In addition, backside vias and pads 655 are plated within the second buildup layer 605.

FIG. 6K shows a stage in the manufacturing process where a first solder resist layer 657 is laminated on one side of the package, and a second solder resist layer 659 is laminated on the other side of the package.

FIG. 6L shows a stage in the manufacturing process where the solder resist 657 is polished or ground to form layer 661 and reveal the additional copper pillars 653 of FIG. 6J.

FIG. 6M shows a stage in the manufacturing process where an FLI layer 663 is attached to the additional copper pillars 653. In addition, vias 665 are created in the second solder resist layer 659, and a SLI pads 667 are placed. After this stage of the manufacturing process, singulation may occur where individual packages are separated from a wafer. In embodiments, this singulation process may involve a diamond saw, or some other technique for physically separating the individual packages.

FIG. 6N shows a stage in the manufacturing process where a protective coating 652, which may be similar to protective coating 452 of FIG. 4, is applied to an edge of the package. As discussed above, this protective coating may be applied using an ink jet type process.

FIG. 6O shows a stage in the manufacturing process where an additional layer 662 is physically and electrically coupled with the package, and includes a first die 620 and a second die 621, which may be similar to dies 420, 421 of FIG. 4. In embodiments, the first die 620 and the second die 621 may be encapsulated in a mold 663.

Figure 7:
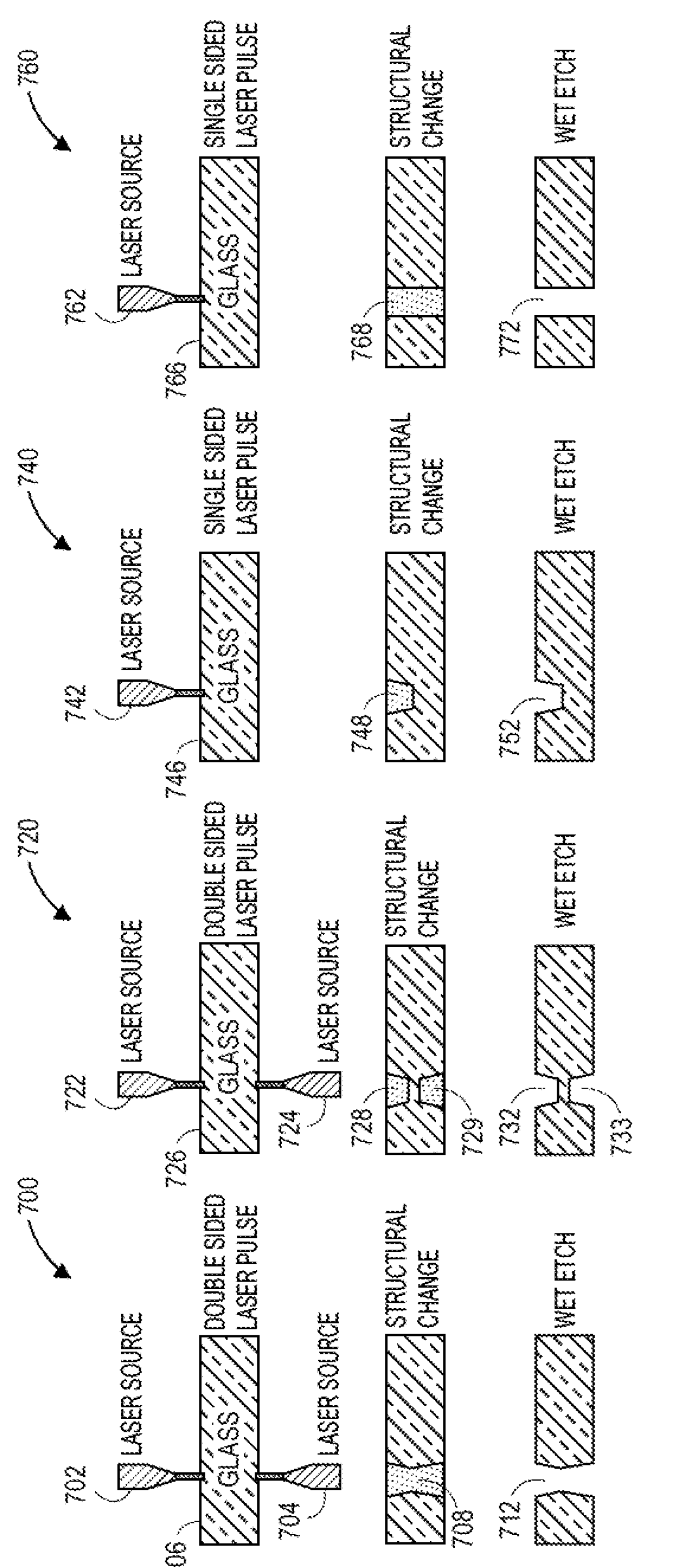
FIG. 7 illustrates multiple examples of laser-assisted etching of glass interconnects processes, in accordance with various embodiments.

FIG. 7 illustrates multiple examples of laser-assisted etching of glass interconnects processes (which may be referred to as "LEGIT" herein), in accordance with embodiments. One use of the LEGIT technique is to provide an alternative substrate core material to the legacy copper clad laminate (CCL) core used in semiconductor packages used to implement products such as servers, graphics, clients, 5G, and the like. By using laser-assisted etching, crack free, high density via drills, hollow shapes may be formed into a glass substrate. In embodiments, different process parameters may be adjusted to achieve drills of various shapes and depths, thus opening the door for innovative devices, architectures, processes, and designs in glass. Embodiments, such as the bridge discussed herein, may also take advantage of these techniques.

Diagram 700 shows a high level process flow for a through via and blind via (or trench) in a microelectronic package substrate (e.g. glass) using LEGIT to create a through via or a blind via. A resulting volume/shape of glass with laser-induced morphology change that can then be selectively etched to create a trench, a through hole or a void that can be filled with conductive material. A through via 712 is created by laser pulses from two laser sources 702, 704 on opposite sides of a glass wafer 706. As used herein, a through drill and a through via refers to when the drill or the via starts on one side of the glass/substrate and ends on the other side. A blind drill and a blind via refers to when the drill or the via starts on the surface of the substrate and stops half way inside the substrate. In embodiments, the laser pulses from the two laser sources 702, 704 are applied perpendicularly to the glass wafer 706 to induce a morphological change 708, which may also be referred to as a structural change, in the glass that encounters the laser pulses. This morphological change 708 includes changes in the molecular structure of the glass to make it easier to etch out (remove a portion of the glass). In embodiments, a wet etch process may be used.

Diagram 720 shows a high level process flow for a double blind shape. A double blind shape 732, 733 may be created by laser pulses from two laser sources 722, 724, which may be similar to laser sources 702, 704, that are on opposite sides of the glass wafer 726, which may be similar to glass wafer 706. In this example, adjustments may be made in the laser pulse energy and/or the laser pulse exposure time from the two laser sources 722, 724. As a result, morphological changes 728, 729 in the glass 726 may result, with these changes making it easier to etch out portions of the glass. In embodiments, a wet etch process may be used.

Diagram 740 shows a high level process flow for a single-blind shape, which may also be referred to as a trench. In this example, a single laser source 742 delivers a laser pulse to the glass wafer 746 to create a morphological change 748 in the glass 746. As described above, these morphological changes make it easier to etch out a portion of the glass 752. In embodiments, a wet etch process may be used.

Diagram 760 shows a high level process flow for a through via shape. In this example, a single laser source 762 applies a laser pulse to the glass 766 to create a morphological change 768 in the glass 766, with the change making it easier to etch out a portion of the glass 772. As shown here, the laser pulse energy and/or laser pulse exposure time from the laser source 762 has been adjusted to create an etched out portion 772 that extends entirely through the glass 766.

With respect to FIG. 7, although embodiments show laser sources 702, 704, 722, 724, 742, 762 as perpendicular to a surface of the glass 706, 726, 746, 766, in embodiments, the laser sources may be positioned at an angle to the surface of the glass, with pulse energy and/or pulse exposure time variations in order to cause a diagonal via or a trench, or to shape the via, such as 712, 772, for example to make it cylindrical, tapered, or include some other feature. In addition, varying the glass type may also cause different features within a via or a trench as the etching of glass is strongly dependent on the chemical composition of the glass.

In embodiments using the process described with respect to FIG. 7, through hole vias 712, 772 may be created that are less than 10 μm in diameter, and may have an aspect ratio of 40:1 to 50:1. As a result, a far higher density of vias may be placed within the glass and be placed closer to each other at a fine pitch. In embodiments, this pitch may be 50 μm or less. After creating the vias or trenches, a metallization process may be applied in order to create a conductive pathway through the vias or trenches, for example a plated through hole (PTH). Using these techniques, finer pitch vias may result in better signaling, allowing more I/O signals to be routed through the glass wafer and to other coupled components such as a substrate.

Figure 8:
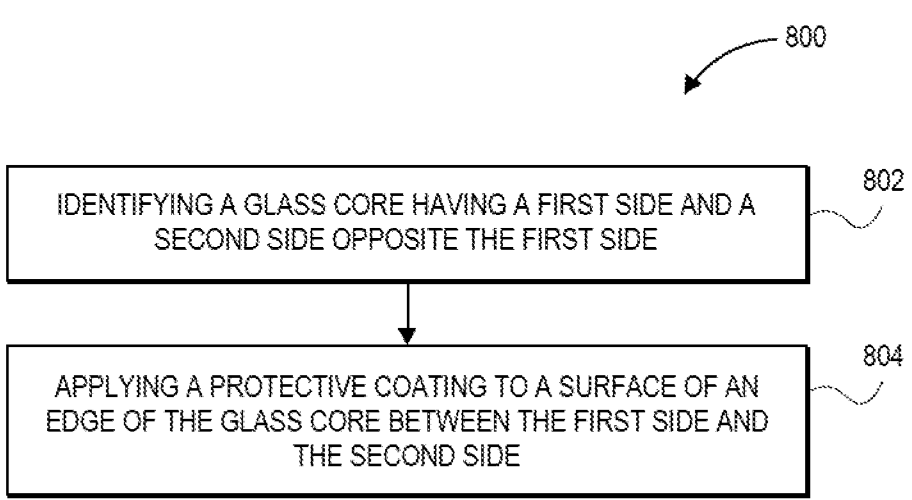
FIG. 8 illustrates an example of a process for manufacturing a substrate that includes a glass core with protective coating on the edge, in accordance with various embodiments.

FIG. 8 illustrates an example of a process for applying a protective coating on an edge of a glass core. Process 800 may be performed using the techniques, methods, systems, and/or apparatus as described with respect to FIGS. 1-7.

At block 802, the process may include identifying a glass core having a first side and a second side opposite the first side.

At block 804, the process may further include applying a protective coating to a surface of an edge of the glass core between the first side and the second side.

Figure 9:
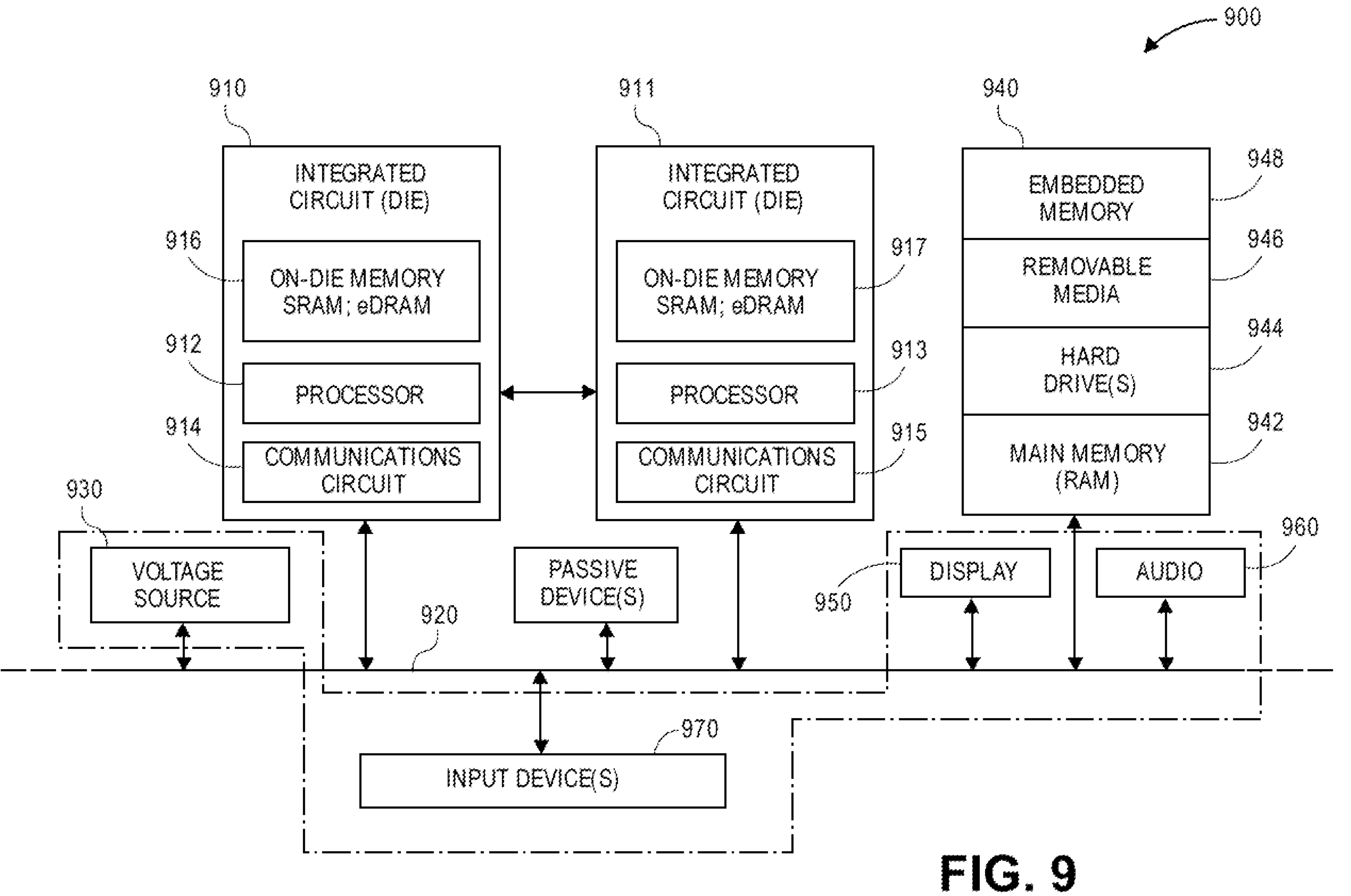
FIG. 9 schematically illustrates a computing device, in accordance with various embodiments.

FIG. 9 is a schematic of a computer system 900, in accordance with an embodiment of the present invention. The computer system 900 (also referred to as the electronic system 900) as depicted can embody a protective coating on an edge of the glass core, according to any of the several disclosed embodiments and their equivalents as set forth in this disclosure. The computer system 900 may be a mobile device such as a netbook computer. The computer system 900 may be a mobile device such as a wireless smart phone. The computer system 900 may be a desktop computer. The computer system 900 may be a hand-held reader. The computer system 900 may be a server system. The computer system 900 may be a supercomputer or high-performance computing system.

In an embodiment, the electronic system 900 is a computer system that includes a system bus 920 to electrically couple the various components of the electronic system 900. The system bus 920 is a single bus or any combination of busses according to various embodiments. The electronic system 900 includes a voltage source 930 that provides power to the integrated circuit 910. In some embodiments, the voltage source 930 supplies current to the integrated circuit 910 through the system bus 920.

The integrated circuit 910 is electrically coupled to the system bus 920 and includes any circuit, or combination of circuits according to an embodiment. In an embodiment, the integrated circuit 910 includes a processor 912 that can be of any type. As used herein, the processor 912 may mean any type of circuit such as, but not limited to, a microprocessor, a microcontroller, a graphics processor, a digital signal processor, or another processor. In an embodiment, the processor 912 includes, or is coupled with, a protective coating on an edge of the glass core, as disclosed herein. In an embodiment, SRAM embodiments are found in memory caches of the processor. Other types of circuits that can be included in the integrated circuit 910 are a custom circuit or an application-specific integrated circuit (ASIC), such as a communications circuit 914 for use in wireless devices such as cellular telephones, smart phones, pagers, portable computers, two-way radios, and similar electronic systems, or a communications circuit for servers. In an embodiment, the integrated circuit 910 includes on-die memory 916 such as static random-access memory (SRAM). In an embodiment, the integrated circuit 910 includes embedded on-die memory 916 such as embedded dynamic random-access memory (eDRAM).

In an embodiment, the integrated circuit 910 is complemented with a subsequent integrated circuit 911. Useful embodiments include a dual processor 913 and a dual communications circuit 915 and dual on-die memory 917 such as SRAM. In an embodiment, the dual integrated circuit 910 includes embedded on-die memory 917 such as eDRAM.

In an embodiment, the electronic system 900 also includes an external memory 940 that in turn may include one or more memory elements suitable to the particular application, such as a main memory 942 in the form of RAM, one or more hard drives 944, and/or one or more drives that handle removable media 946, such as diskettes, compact disks (CDs), digital variable disks (DVDs), flash memory drives, and other removable media known in the art. The external memory 940 may also be embedded memory 948 such as the first die in a die stack, according to an embodiment.

In an embodiment, the electronic system 900 also includes a display device 950, an audio output 960. In an embodiment, the electronic system 900 includes an input device such as a controller 970 that may be a keyboard, mouse, trackball, game controller, microphone, voice-recognition device, or any other input device that inputs information into the electronic system 900. In an embodiment, an input device 970 is a camera. In an embodiment, an input device 970 is a digital sound recorder. In an embodiment, an input device 970 is a camera and a digital sound recorder.

As shown herein, the integrated circuit 910 can be implemented in a number of different embodiments, including a package substrate having a protective coating on an edge of the glass core, according to any of the several disclosed embodiments and their equivalents, an electronic system, a computer system, one or more methods of fabricating an integrated circuit, and one or more methods of fabricating an electronic assembly that includes a package substrate having a protective coating on an edge of the glass core, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having a protective coating on an edge of the glass core embodiments and their equivalents. A foundation substrate may be included, as represented by the dashed line of FIG. 9. Passive devices may also be included, as is also depicted in FIG. 9.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

The following paragraphs describe examples of various embodiments.

EXAMPLES

Example 1 is a substrate comprising: a glass core with a first side and a second side opposite the first side; and a protective coating coupled with a surface of an edge of the glass core between the first side and the second side.

Example 2 includes the substrate of example 1, wherein the protective coating includes a water soluble emulsion resin.

Example 3 includes the substrate of example 1, wherein the protective coating adheres to the surface of the edge of the glass core.

Example 4 includes the substrate of example 1, wherein the protective coating has a thickness of between 0.1 micrometers and 1000 micrometers.

Example 5 includes the substrate of example 1, wherein the protective coating partially covers the surface of the edge of the glass core.

Example 6 includes the substrate of example 1, wherein the edge of the glass core includes one or more cracks; and wherein the protective coating fills in at least a portion of the one or more cracks.

Example 7 includes the substrate of example 1, wherein the protective coating is coupled with a plurality of surfaces, respectively, of a plurality of edges of the glass core between the first side and the second side.

Example 8 includes the substrate of example 1, further comprising a buildup layer coupled with the first side of the glass core or with the second side of the glass core.

Example 9 includes the substrate of example 8, wherein the protective coating is applied to a surface of an edge of the buildup layer proximate to the edge of the glass core.

Example 10 includes the substrate of any one of examples 1-9, wherein the glass core includes one or more through glass vias (TGV) extending from the first side of the glass core to the second side of the glass core.

Example 11 is a method comprising: identifying a glass core having a first side and a second side opposite the first side; and applying a protective coating to a surface of an edge of the glass core between the first side and the second side.

Example 12 includes the method of example 11, wherein the protective coating includes a water soluble emulsion resin.

Example 13 includes the method of example 11, wherein the protective coating has a thickness of between 0.1 micrometers and 1000 micrometers.

Example 14 includes the method of example 11, wherein after the step of identifying a glass core, the method further comprising: forming a buildup layer on the first side of the glass core; and wherein applying a protective coating to a surface of an edge of the glass core further includes applying the protective coating to the surface of the edge of the glass core and a surface of an edge of the buildup layer.

Example 15 includes the method of any one of examples 11-14, wherein applying a protective coating to a surface of an edge of the glass core further includes applying the protective coating within one or more cracks within the edge of the glass core.

Example 16 is a package comprising: a substrate that includes: a glass core with a first side and a second side opposite the first side; a first buildup layer formed on the first side of the glass core; a second buildup layer formed on the second side of the glass core; and a protective coating coupled with a surface of an edge of the glass core between the first side of the glass core and the second side of the glass core; and one or more dies electrically or physically coupled with the first buildup layer of the substrate.

Example 17 includes the package of example 16, wherein the protective coating is coupled with a surface of an edge of the first buildup layer and the second buildup layer.

Example 18 includes the package of example 16, wherein the glass core includes one or more through glass vias (TGV), wherein electrically conductive material within the TGV electrically couples the first buildup layer and the second buildup layer.

Example 19 includes the package of example 16, wherein the protective coating includes a water soluble emulsion resin; and wherein the protective coating has thickness of between 0.1 micrometers and 1000 micrometers.

Example 20 includes the package of any one of example 16-19, wherein the edge of the glass core includes one or more cracks; and wherein the protective coating fills at least a portion of the one or more cracks.

What is claimed is:

1. A substrate comprising:

a glass core with a first side and a second side opposite the first side, the glass core having a conductive via therein, the conductive via extending from the first side to the second side;

a buildup layer coupled with the first side of the glass core or with the second side of the glass core, the buildup layer comprising a plurality of dielectric layers and a plurality of metal layers, wherein one of the plurality of metal layers of the buildup layer is electrically coupled to the conductive via in the glass core;

a protective coating along an entirety of a surface of an edge of the glass core between the first side and the second side and along an entirety of a surface of an edge of the buildup layer proximate to the edge of the glass core, wherein the protective coating includes a water soluble emulsion resin, and wherein the protective coating has a thickness of between 0.1 micrometers and 1,000 micrometers; and a layer comprising a die surrounded by a mold compound, wherein the layer is over the glass core and the buildup layer, and wherein the protective coating is not along an edge of the layer.

2. The substrate of claim 1, wherein the protective coating adheres to the surface of the edge of the glass core.

3. The substrate of claim 1, wherein the edge of the glass core includes one or more cracks; and wherein the protective coating fills in at least a portion of the one or more cracks.

4. The substrate of claim 1, wherein the protective coating is coupled with a plurality of surfaces, respectively, of a plurality of edges of the glass core between the first side and the second side.

5. A package comprising:

a substrate that includes:

a glass core with a first side and a second side opposite the first side, the glass core having a conductive via therein, the conductive via extending from the first side to the second side;

a first buildup layer formed on the first side of the glass core, the first buildup layer comprising a first plurality of dielectric layers and a first plurality of metal layers, wherein one of the first plurality of metal layers of the first buildup layer is electrically coupled to the conductive via in the glass core;

a second buildup layer formed on the second side of the glass core, the second buildup layer comprising a second plurality of dielectric layers and a second plurality of metal layers, wherein one of the second plurality of metal layers of the second buildup layer is electrically coupled to the conductive via in the glass core;

a protective coating along an entirety of a surface of an edge of the glass core between the first side of the glass core and the second side of the glass core, along an entirety of a surface of an edge of the first buildup layer proximate to the edge of the glass core, and along an entirety of a surface of an edge of the second buildup layer proximate to the edge of the glass core, wherein the protective coating includes a water soluble emulsion resin, and the protective coating has a thickness of between 0.1 micrometers and 1,000 micrometers; and a layer comprising a die surrounded by a mold compound, wherein the layer is over the glass core and the first buildup layer, and wherein the protective coating is not along an edge of the layer.

6. The package of claim 5, wherein the edge of the glass core includes one or more cracks; and wherein the protective coating fills at least a portion of the one or more cracks.

7. A method comprising:

forming a glass core with a first side and a second side opposite the first side, the glass core having a conductive via therein, the conductive via extending from the first side to the second side;

coupling a buildup layer with the first side of the glass core or with the second side of the glass core, the buildup layer comprising a plurality of dielectric layers and a plurality of metal layers, wherein one of the plurality of metal layers of the buildup layer is electrically coupled to the conductive via in the glass core;

applying a protective coating to an entirety of a surface of an edge of the glass core between the first side and the second side and to an entirety of a surface of an edge of the buildup layer proximate to the edge of the glass core, wherein the protective coating includes a water soluble emulsion resin, and wherein the protective coating has a thickness of between 0.1 micrometers and 1,000 micrometers; and forming a layer comprising a die surrounded by a mold compound, wherein the layer is over the glass core and the buildup layer, and wherein the protective coating is not along an edge of the layer.

8. The method of claim 7, wherein applying the protective coating to the entirety of the surface of the edge of the glass core further includes applying the protective coating within one or more cracks within the edge of the glass core.

* * * * *